US006207472B1

(12) United States Patent
Callegari et al.

(10) Patent No.: US 6,207,472 B1
(45) Date of Patent: Mar. 27, 2001

(54) LOW TEMPERATURE THIN FILM TRANSISTOR FABRICATION

(75) Inventors: Alessandro Cesare Callegari, Yorktown Heights; Christos Dimitrios Dimitrakopoulos, West Harrison; Sampath Purushothaman, Yorktown Heights, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/265,161

(22) Filed: Mar. 9, 1999

(51) Int. Cl.$^7$ ........................................ H01L 51/40
(52) U.S. Cl. .................. 438/99; 438/149; 438/158; 438/216; 438/240; 438/287; 438/785
(58) Field of Search ............... 438/99, 149, 216, 438/287, 158, 240, 785

(56) References Cited

U.S. PATENT DOCUMENTS

| 5,347,144 | 9/1994 | Garnier et al. ............. 257/40 |
| 5,946,551 | * 8/1999 | Dimitrakopoulos et al. . |
| 5,981,970 | * 11/1999 | Dimitrakopoulos et al. . |

OTHER PUBLICATIONS

Horowitz et al, "A Field Effect Transistor Based on Conjugated Alpha–Sexithienyl," Solid State Communications, vol. 72, No. 4, pp. 381–384, 1989.

Lin et al, "High Mobility Pentacene Organic Thin Film Transistors" IEEE 54$^{th}$ Annual Device Research Conf. Digest, 1996, pp. 80–81.

Chen et al, "High Field Effect Mobility a-Si:H TFT Based on High Deposition Rate Materials" IEEE 54$^{th}$ Annual Device Research Conf. Digest, 1996, pp. 68–69.

Wu et al. "Highly Insulative Barium–Zirconite–Titanate Thin Films Prepared by RF Magnetron Sputtering for Dynamic Random Access Memory Applications" Applied Physics Letters 69(18) Oct. 28, 1996 pp. 2659–2661.

Dimitrakopoulos et al, "Molecular Beam Deposited Thin Films of Pentacene for Organic Field Transistor Applications," J. App. Phys., 80,(4) Aug. 15, 1996 pp. 2501–2508.

P. Balk, "Dilectrics for Field Effect Technology", Advanced Materials, vol. 7 No. 8, 1995 pp. 703–710.

Brown et al, "Precursor Route Pentacene Metal–Insulator–Semiconductor Field Effect Transistors", J. App. Phys. 79(4) Feb. 15, 1996, pp. 2136–2138.

Garnier et al, "All Polymer Field Effect Transistor Realized by Printing Techniques", Science, vol. 265, Sep. 16, 1994, pp. 1684–1686.

Bao et al, "High–Performance Plastic Transistors Fabricated by Printing Techniques", Chem. Mater., vol. 9, 1997, pp. 1299–1301.

"All–Polymer Integrated Circuits", Semiconductor International, Apr. 1998, p. 42.

Dimitrakopoulos et al, "Low Voltage Organic Transistors on Plastic Comprising High–Dielectric Constant Gate Insulators", Science, vol. 283, Feb. 5, 1999, pp. 822 to 824 and 771 and 772.

* cited by examiner

Primary Examiner—John F. Niebling
Assistant Examiner—Jonathan Hack
(74) Attorney, Agent, or Firm—Daniel P. Morris; Alvin J. Riddles (57) ABSTRACT

The invention broadens the range of materials and processes that are available for Thin Film Transistor (TFT) devices by providing in the device structure an organic semiconductor layer that is in contact with an inorganic mixed oxide gate insulator involving room temperature processing at up to 150 degrees C.

A TFT of the invention has a pentacene semiconductor layer in contact with a barium zirconate titanate gate oxide layer formed on a polycarbonate transparent substrate employing at least one of the techniques of sputtering, evaporation and laser ablation.

10 Claims, 5 Drawing Sheets

LOW TEMPERATURE THIN FILM TRANSISTOR FABRICATION

Cross Reference is made to U.S. Pat. Nos. 5,996,551 and 5,981,570; assigned to the assignee of this application; arising out of a continuing technological effort and incorporated herein by reference.

FIELD OF THE INVENTION

This invention pertains to thin film field effect transistors (TFT), and in particular to the structure and processing of such TFT devices at a low, of the order of 150 degrees C., or less temperature.

BACKGROUND AND RELATION TO THE PRIOR ART

Thin film field effect transistors (TFT), useful in flat panel display applications, at the current state of the art, involve a semiconductor layer with a channel defined by separated source and drain electrodes on one side and an insulated gate electrode on the other side that is centered with respect to the channel. The structure of the TFT device is usually fabricated through a set of serial deposition operations of carefully controlled layers on a substrate. The desired TFT electrical performance involves low voltage operation with high carrier mobility in the channel, and with current vs voltage output characteristics that include a steep slope followed by a saturation region.

The current TFT devices typically use amorphous silicon (a—Si:H) as the semiconductor and silicon oxide and/or silicon nitride as the gate insulator. Some attention in the art is being directed toward the use of semiconducting organic compounds as potential replacements for amorphous silicon as the semiconductor.

As the art is progressing, in addition to the ever increasing stringency of requirements for increases in density and responsiveness of the components, it is also becoming desirable that transparent substrates have mechanical flexibility, impact resistance and light weight. Meeting all the constraints is becoming more difficult to achieve. Many materials and processing techniques used in the fabrication of active matrix liquid crystal displays (AMLCD), that are based on a—Si: H TFT devices involve temperatures above 350 degrees C. which operates to eliminate many otherwise useful substrate materials. A need is growing in the art for a broader range of materials and processes for TFT devices, particularly under the rigorous criteria in the display type of application. Transparent plastic substrates for AMLCD are very desirable but cannot withstand temperatures above 150–200 degrees C.

SUMMARY OF THE INVENTION

The invention broadens the range of materials and processes available for TFT devices by providing in the device suture an organic semiconductor layer that is in contact with an inorganic mixed oxide gate insulator involving processing with the types of processing techniques that can take place in a temperature range from about room temperature to about 150 degrees C.

A TFT of the invention has a pentacene semiconductor layer in contact with a barium zirconate titanate gate insulator layer formed on a polycarbonate transparent substrate employing at least one of the techniques of sputtering, spinning, evaporation and laser ablation.

BRIEF DESCRIPTION OF THE DRAWINGS

FIGS. 8 through 16 are data plots of the examples of the present invention wherein:

FIGS. 8, 9 and 10 show the operating characteristics of one example of a TFT device of the present invention.

FIGS. 11–15 show operating characteristic data of a second example of a TFT device of the invention using the organic semiconductor pentacene as the semiconductor and a 122 nm thick layer of barium zirconate titanate deposited by room temperature sputtering, as the gate insulator.

FIG. 14 shows the dependence of the drain current on the source-drain voltage at different gate voltage levels, and, FIG. 15 is a plot of the drain current as a function of the gate voltage in the linear regime at a fixed drain voltage for calculation of the mobility in the linear regime of TFT operation.

FIG. 16 shows the dependence of the drain current on the source-drain voltage at different gate voltage levels, from a third example TFT device fabricated on a transparent polycarbonate substrate using pentacene as semiconductor and a 128 nm thick layer of barium zirconate titanate (BZT) deposited by room temperature sputtering as the gate insulator.

DESCRIPTION OF THE INVENTION

Figure 1:
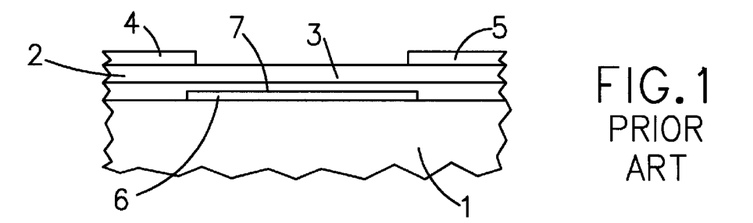
FIG. 1 is a depiction of typical elements in a prior art type TFT device.

Referring to FIG. 1, which is illustrative of the present state of the art, the TFT device is supported by an insulting substrate 1 with the device having a semiconductor region 2 with field effect transistor channel 3 defining, separated, source 4 and drain 5 on one side of the semiconductor region 2, and a gate 6 electrode separated by insulation 7 from the channel 3 and centered with respect to the channel 3 on the other side of the semiconductor region 2. The desired electrical performance of the device places stringent material and dimensional requirements on the layers and on the processing parameters in building the device. Many of the present devices use amorphous silicon (a—Si:H) as the semiconductor 2, and conventional dielectric materials such as SiO, $SiO_2$, or $Si_3N_4$, as the gate insulator 7. The substrate 1 is usually glass. The materials used and the processing that must be employed therewith, during fabrication of these devices result in temperature excursions in the several hundreds of degrees C. being required.

As the art is developing, in addition to increased limitations driven by higher performance, it is becoming desirable to impart the physical properties of mechanical flexiblity, impact resistance, and lighter weight into the device, which in turn may affect the selection of the materials, the dimensions and the processing of the semiconductor 2, the gate insulator 7 and the substrate 1.

In accordance with the invention it has been found that with the combined use of an organic semiconductor together with an inorganic oxide gate insulator 7 which is processed with room temperature vicinity type processes which are in the temperature range of about 25 to about 150 degrees C. and which has dielectric constant values of 15 and above, devices with acceptable TFT carrier mobility in the channel 3 can be produced; and further the room temperature vicinity type processes also permit broadening the range of available materials for substrate 1 to include thin and transparent plastics such as polycarbonate films. The room temperature vicinity type processes may be considered to be those in which in the deposition and in any subsequent annealing type step the temperature is up to about 150 degrees C.; which temperature range is far below the 300–400 degree C. range presently used in the art. Such processes would include for examples sputtering, spinning, evaporation and laser ablation.

Figure 4:
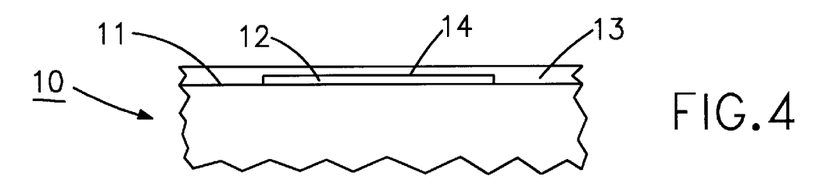
Figure 5:
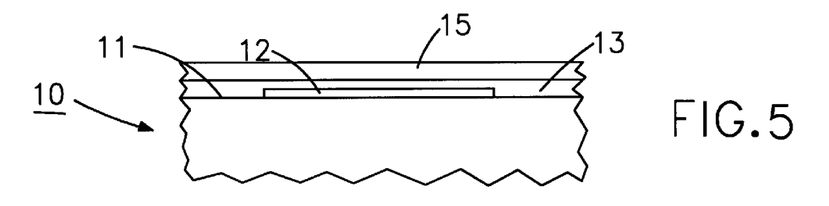
Figure 6:
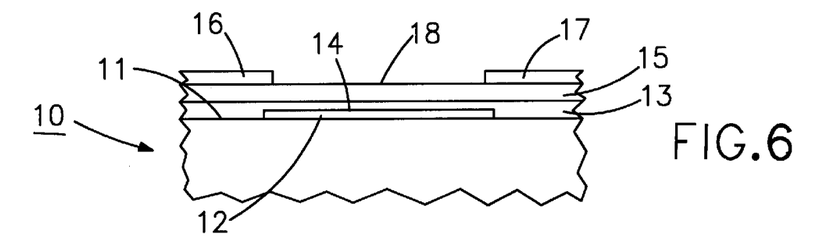
FIG. 6 is a depiction of all the elements in a TFT in accordance with the present invention.

In FIGS. 2–6 the partial product depictions illustrated in FIGS. 2–5 result in the novel TFT depicted in FIG. 6

Figure 2:
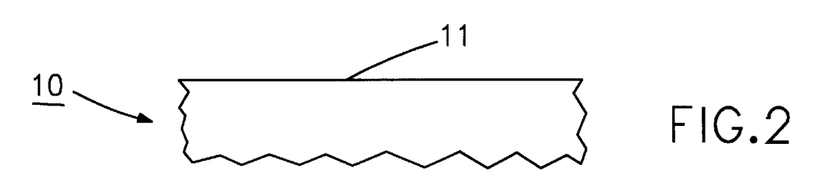
FIGS. 2 to 5 are depictions of the partial products at intermediate steps in the fabrication of a TFT in accordance with the present invention.

Referring to FIG. 2 the TFT device is built on a substrate 10 which provides support for fabrication of the device on surface 11 and serves as a portion of the completed device. During fabrication the substrate is held in the vicinity of room temperature (25 degrees C.) Silicon oxide, quartz and glass are satisfactory substrate and supporting materials; further, through the capabilities conferred by the invention the choices for a substrate material is broadened to include plastics such as polycarbonates which provide additional properties of impact resistance, lightness of weight and flexibility.

Figure 3:
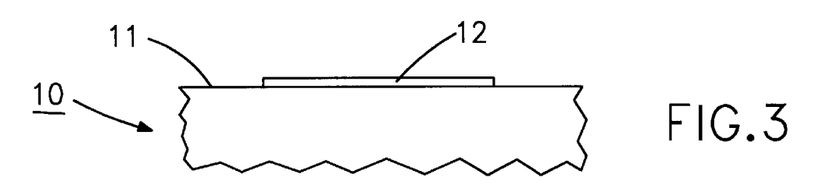

Referring to FIG. 3 the first, of the gate and the source and drain electrodes, the gate electrode 12, is positioned on the surface 11. The electrode 12 is about 0.1 micrometer in thickness. Satisfactory materials are metals such as gold, silver, palladium, aluminum, copper and platinum and conducting polymers such as polyaniline and polypyrrole. The resistance of the electrodes and connecting members should be selected so that signal deterioration due to resistance is minimized.

Referring to FIG. 4, in accordance with the invention the gate dielectric member 13 is of an inorganic oxide that is deposited on the surface 11 over the gate electrode 12. The deposition is accomplished with one of the low temperature techniques of sputtering, spinning, evaporation and ablation, at a room temperature vicinity temperature range of about 25–150 degrees C. Suitable inorganic oxides at the present state of the art may include $Ta_2O_3$, $V_2O_3$, $TiO_2$, and the ferroelectric insulators $Bi_4Ti_3O_{12}$, $BaMgF_4$, $SrTiO_3$, which within the class include the mixed oxides $SrBi_2Ta_{(1-x)}Nb_xO_3$, $PbZr_xTi_{(1-x)}O_3$, known in the art as (PZT), $BaZr_xTi_{(1-x)}O_3$, known in the art as (BZT), and $Ba_xSr_{(1-x)}TiO_3$, known in the art as (BST). Of the mixed oxide example materials, the BZT material has received some background attention in the publication by Wu et al., in Appl. Phys. Lett. 69, 1996, pages 2659–2661. The gate dielectric 13 is deposited to a thickness in the region 14 above the gate electrode 12 in the range of 0.5 micrometer. In accordance with the invention the room temperature vicinity of up to about 150 degrees C. deposition of inorganic gate oxide materials provides a device gate insulator with a dielectric constant in the range of 15 or above which is adequate to provide satisfactory carrier mobility in the being fabricated device channel. Heretofore in the art, much higher dielectric constants around 300 were involved and which required very high temperature annealing steps that were incompatible with some materials. Further, the intended applications of those high dielectric constant devices were not displays but were devices built on silicon substrates.

Referring to FIG. 5, the organic semiconductor 15 of the TFT device of the invention, is deposited at a room temperature vicinity temperature, over the gate insulation layer 13. A satisfactory organic semiconductor material is the material pentacene, which in a TFT device can impart performance in which there is a field effect carrier mobility of about 0.6 $cm^2$ $V^{-1}$ $sec^{-1}$ in the channel, and current modulation of up to $10^8$ at operating voltage ranges of up to ±100 V. The material pentacene has received some background attention in the art as described in the following publications: Lin et al. IEEE 54th Annual Device Research Conference, 1996, Pages 80–81, Brown et al., J. Appl. Phys. 79, (4), 1996, Pages 2136–2139, and Dimitrakopoulos et al., J. Appl. Phys. 80, (4), 1996, Pages 2501–2507. Further, in the cross referenced now issued U.S. Pat. Nos. 5,996,551 and 5,981,570, it has been shown how the above described performance can be achieved at much lower operating voltages (5 to 10 V) using an inorganic gate dielectric with a dielectric constant of greater than 15. Referring to FIG. 6, the TFT of the invention is depicted. The source 16 and drain 17 with the channel defining separation 18 centered over the gate 12 are deposited in registration with the gate 12 on the exposed surface of the organic semiconductor member 15 using a low temperature deposition process at a room temperature vicinity temperature. The layers deposited and operated in the 25 to 150 degrees C. vicinity of room temperature are well matched to the moderate dielectric needs of the organic semiconductors and enable processing and service with much lower temperature tolerant substrates, such as plastic.

In the process described in connection with FIGS. 2–6 it will be apparent that protective coatings can be placed over the exposed surfaces and annealing of layers can be employed where desired so long as within the room temperature vicinity temperature range.

Figure 7:
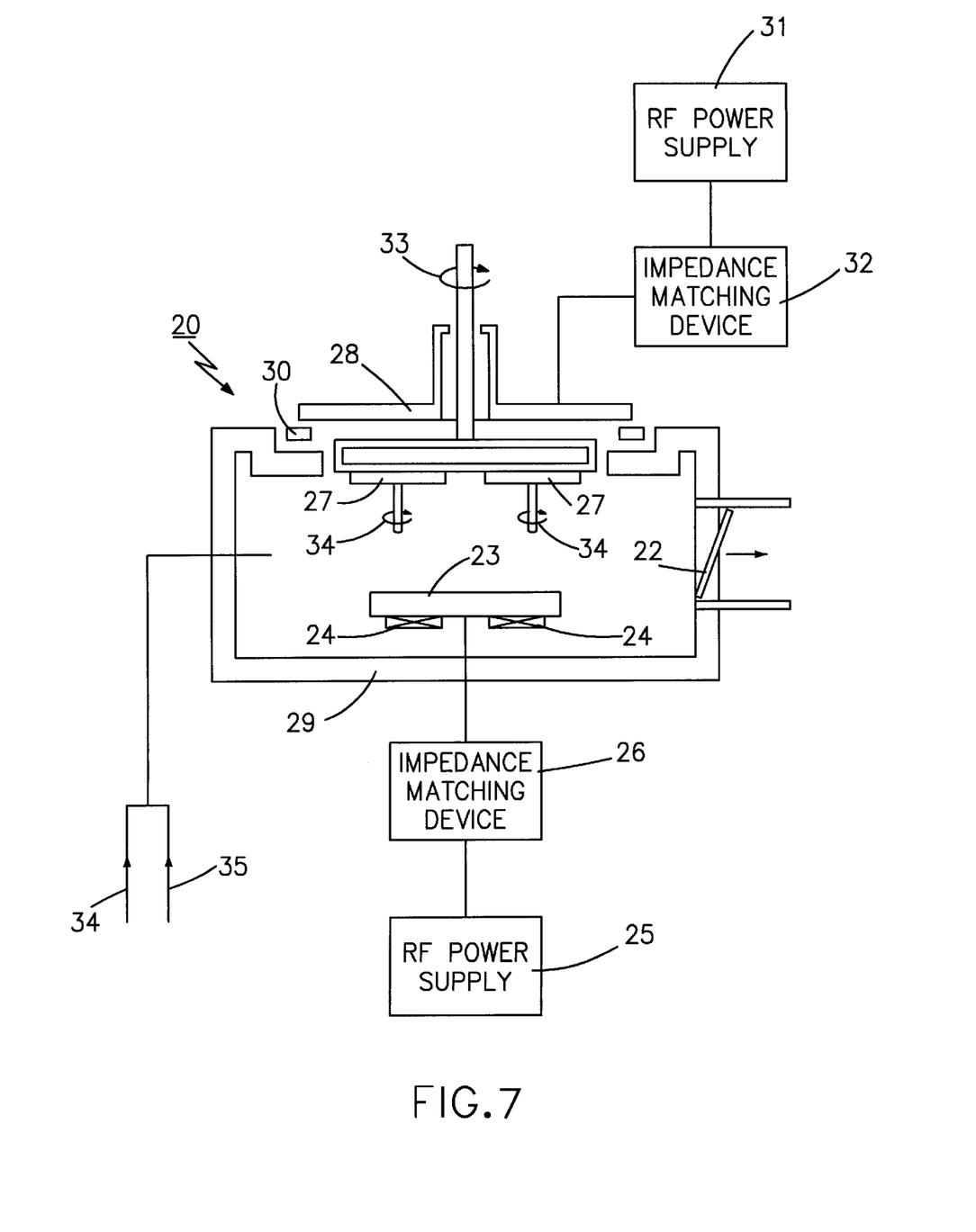
FIG. 7 is a sketch of a room temperature sputter deposition processing apparatus.

An illustration of the room temperature type deposition technique involving sputtering is provided in connection with the apparatus depicted in FIG. 7. Referring to FIG. 7 there is shown a schematic of a sputter deposition apparatus 20 that can be used to deposit the layer 13 of the invention using as a specific example the inorganic mixed oxide material Barium-Zirconate-Titanate (BZT). It will be apparent to one skilled in the art that the apparatus of FIG. 7 is but one example of useable systems that can be varied in size and throughput. The apparatus 20 includes a sputtering chamber 21, having a throttle valve 22 which separates the reactor chamber 21 from a vacuum pump not shown. A pressed powder BZT sputtering target 23 such as is manufactured by PURE TECH, in Carmel N.Y., is mounted in the reactor chamber 21. Permanent magnets 24 are located on the backside of the target 23 to enhance plasma density during the sputtering. The sputtering target 23 is electrically isolated from the housing 29 and electrically connected to a RF power supply 25 through an impedance matching device 26. One or more substrates 27 such as silicon wafers, glass plates or polycarbonate sheets, are mounted on a sample holder 28 which is isolated from the reactor chamber housing 29 by a dielectric spacer 30. The housing 29 is maintained at a selected temperature such as room temperature. The sample holder 28 can be RF biased for plasma cleaning using a RF power supply 31 connected through an impedance matching device 32. The substrate holder 28 is also provided with rotation capability at 33. The substrates 27 have planetary rotation capability 34 to assure uniformity across the substrate being coated. The films deposited at room temperature are well matched to the moderate dielectric needs of the organic semiconductor TFT's and enable broadening the range of useable substrates to include processing on plastic substrates.

Continuing to refer to FIG. 7, The reactor chamber 20 also contains conduits 34 and 35 for introducing various gases. For example, argon could be introduced through conduit 34 and oxygen through conduit 35.

Gases employed in the following examples of the invention should have a purity greater than about 95.5%; with a purity in the range from about 98.5 to about 99.99% being preferred.

In FIG. 7, the argon and oxygen gases are introduced into the chamber by first passing them through separate flow controllers at a sufficient flow to provide a total pressure of Ar and oxygen from about 1 mTorr to 50 mTorr. The Ar and oxygen flows are from about 100 to 1 sccm, more preferably the Ar flow is about 10 sccm and the oxygen flow about 2 sccm. To provide the most effective deposited layer such as a BZT film, it is preferred that the pressure of argon and oxygen be about 2–3 mTorr. Such conditions can also be obtained by premixing the Ar and oxygen in one gas cylinder providing the desired gas concentration. Preferably the argon and oxygen gases are introduced as illustrated into the chamber through two separate flow controllers in conduits 34 and 35.

Suitable substrates which may be coated with the room temperature vicinity deposited layers or films of the invention include materials such as plastic; metals; various types of glass; quartz; silicon wafers and the likes thereof. A substrate to be coated may be any shape or size compatible with being placed into asputtering chamber apparatus. Thus, regular or irregular shape objects having any dimension may be used and depending on the design of the sputtering system with modifications to the vacuum chamber, coatings can be applied to sheet materials fed in a roll to roll format. In operation, the substrate is mounted on the substrate holder inside the reactive sputtering chamber of the sputter system. The reactive sputtering chamber is then tightly sealed and evacuated until a pressure reading in the range of about $1\times10^{-4}$ to about $1\times10^{-7}$ Torr is obtained. Most preferably, the substrate is held at a constant, room temperature value of about 25 degrees C. throughout the entire deposition process. Where desired the substrate material used may be subjected to in-situ plasma cleaning; using for example $H_2$, Ar, $O_2$, or $N_2$ type plasma sputter etching techniques.

After achieving the desired pump down pressure, the admixed gases are introduced into the reaction sputter chamber at example flow rates of about 1 to 100 standard cubic centimeters per minute (sccm); with the flow rate of the Ar gas being at about 10 sccm and oxygen being at about 2 sccm. The gases in this example would be introduced into the reaction chamber at a pressure of about 1 to 20 mTorr; with an admixture pressure of about 3 mTorr. being preferred.

In order to obtain a reactive sputtering plasma of the gas mixture, an rf power density from about 0.05 to 4 W/cm$^2$ would be applied to the example BZT target 23 throughout the deposition process. Most preferably, the rf power would be maintained at 0.8 W/cm$^2$ throughout the deposition process through the RF power supply source involving elements 25 and 26. The BZT film is deposited onto the substrate at a rate of about 10 Angstroms/min., such that an essential continuous coating of the film on the substrate is obtained. These conditions permit film depositions in thicknesses in a range of about 100 to 5000 Angstroms with about 1250 being preferred.

In the following paragraphs examples 1, 2 and 3 are provided that illustrate the deposition and the construction of the invention. Although a sputter deposition process is used as an example in connection with FIG. 7, the other room temperature vicinity type processes can be used.

EXAMPLE 1

Substrates such as silicon wafers with a blanket coating of 150 Å titanium followed by 400 Å of platinum can be loaded into a BZT sputter deposition chamber as descried in connection with FIG. 7. The chamber is pumped down to a base pressure of $2.1\times10^{-7}$ torr after which a flow of 10 standard cubic centemeters per minute (sccm) of argon and 2 sccm of oxygen gas are introduced into the chamber through elements 34 and 35. By appropriate valving of the chamber, a total pressure of 2 mtorr is achieved. After purging this gas for 5 minutes, a plasma is ignited in the chamber by applying a radio frequency ac voltage through elements 25 and 26 to the BZT sputter target 23 while maintaining the chamber at ground potential. The ions in the rf plasma thus created is used to reactively sputter the BZT from the target on to the samples 27 loaded in the chamber. A total power of 100 watts which corresponds to a power density of about 0.8 watts/cm$^2$ is employed to achieve a BZT thickness of about 1250 Å.

The wafers are unloaded at the end of the run and provided with an array of top electrode dots consisting of a bilayer of 5000 Å Al/600 Å Au deposited by electron beam evaporation through a metal mask in a different vacuum system. These parts are used to measure the dielectric constant and breakdown characteristics of the BZT films. The dielectric constant is 17.3 and the breakdown field about 1 MV/cm for BZT films of 1250 Å thickness.

Using the methodology described above, the deposited BZT films at room temperature thus range in thickness from 1000 to 2000 Å with a dielectric constant in the range of 15 to 20 which can sustain fields of about 1 MV/cm without breakdown.

EXAMPLE 2

TFT's having as gate insulator a thin film of barium zirconate titanate (BZT), are fabricated by means of room temperature vicinity type rf sputtering as described in Example 1 together with the TFT fabrication steps described in connection with FIGS. 2–6. In this particular example, oxidized silicon substrates are cleaned in an isopropanol bath using ultrasonic agitation and dried with nitrogen. They are then assembled with a metal mask with openings corresponding to the gate lines and placed and pumped down to high vacuum in an electron beam evaporator. Gate metallization of either 400 Å of aluminum or a bilayer of 150 Å of titanium followed by 300 Å of platinum is deposited on the substrates by electron beam evaporation. Then a gate insulator film 13 of BZT is deposited on top of the gate 12 and the substrate surface 11, as described in example 1.

An organic semiconductor pentacene layer 15 is deposited on the BZT gate insulator 13 using thermal evaporation in a vacuum chamber through a mask that separates individual devices from each other and reduces fringe currents which are currents that pass through the pentacene layer that is deposited outside the area of the devices. Satisfactory results are achieved with both the ultra high and the high vacuum chambers. The samples may then be assembled with a mask provided with openings for source and drain contact electrodes, placed and pumped down in an electron beam evaporator and coated with 600 Å of gold to produce the source 16 and drain 17 contacts. The resulting TFT structure is shown schematically in FIG. 6 Alternatively, it will be apparent to one skilled in the art that the source 16 and drain 17 contacts can be placed on top of the insulator 13 and then the pentacene layer 15 placed over them.

There are many aspects of manufacturing flexibility in room temperature vicinity deposition techniques. For one example, in depositing, the pentacene film 15 could be deposited using a soluble precursor of pentacene which is converted to pentacene by heating up to 140° C. in vacuo as described in the publication by A. R. Brown et al. in the *J App. Phys.*, Volume 79, pg 2136, 1996. Similarly, in materials, there is a wide range of electrode materials such as molybdenum, tungsten, nickel, platinum, palladium, conducting polymers, oligomers and organic molecules.

Completed TFT samples are then tested electrically using a Hewlett Packard Model 4145B semiconductor parameter analyzer to determine the operating characters described in connection with FIGS. 8 to 16.

Figure 8:
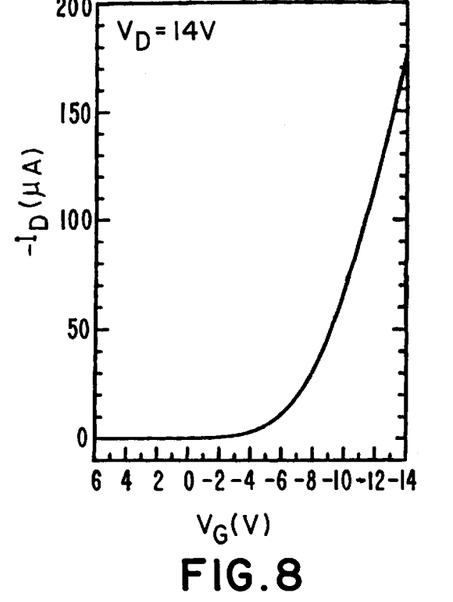
FIG. 8 shows data on the organic semiconductor pentacene as the semiconductor and a 122 nm thick layer of barium zirconate titanate(BZT), deposited by room temperature sputtering, as the gate insulator; illustrating the dependence of the drain current on the gate voltage at a fixed source-drain voltage.
Figure 9:
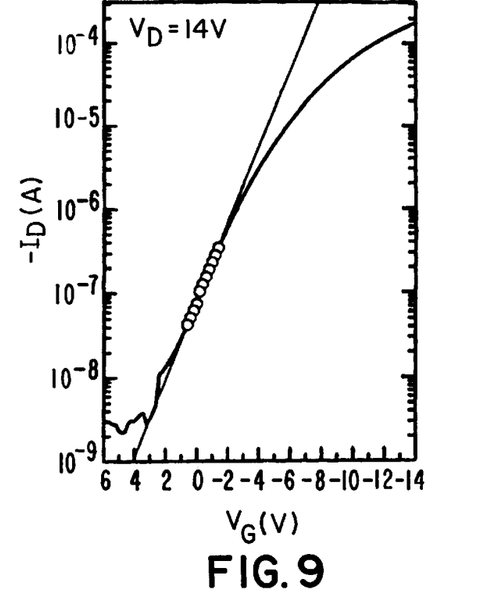
FIG. 9 is a plot of the data from FIG. 8 in a semi logarithmic scale used to calculate the current modulation and sub-threshold slope.
Figure 10:
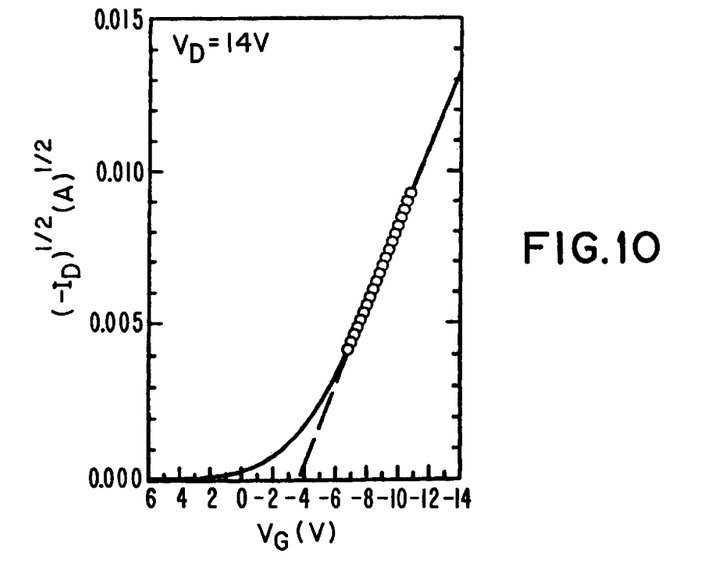
FIG. 10 is a replot of the data from FIG. 9 as the square root of the drain current plotted versus the gate voltage in the saturation regime in order to calculate the field effect mobility.

Referring to FIGS. 8, 9 and 10, which are typical operating characteristics of a pentacene organic semiconductor TFT, with an inorganic mixed oxide gate dielectric of BZT as represented by the schematic drawing in FIG. 6, in which the thickness of the BZT gate-insulator is approximately 1220 Å and its dielectric constant, is 17.3. The BZT is deposited by sputter deposition as described in connection with FIG. 7. The source drain separation (channel length, L) is 18.4 $\mu$m and the channel width, W, is 1500 $\mu$m. FIGS. 8 and 9 show the dependence of Drain Current ($I_D$) on Gate Voltage ($V_G$) in saturation. FIG. 10 shows a plot of the square root of $I_D$ vs $V_G$. The field effect mobility, $\mu$, is calculated from the slope of the plot to be 0.32 cm$^2$ V$^{-1}$ sec$^{-1}$. The current modulation is about $10^5$ for a gate voltage variation of 19 volts (+5 to −14 V). The sub-threshold slope, is approximately 2 volts per decade of current modulation.

Figure 11:
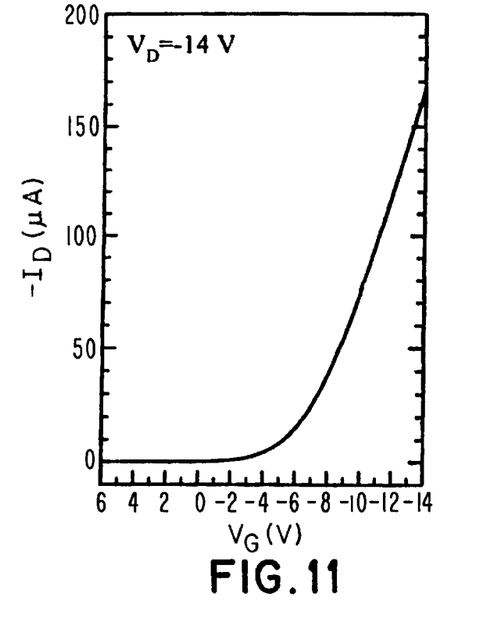
FIG. 11 shows the dependence of the drain current on the gate voltage at a fixed source-drain voltage.
Figure 12:
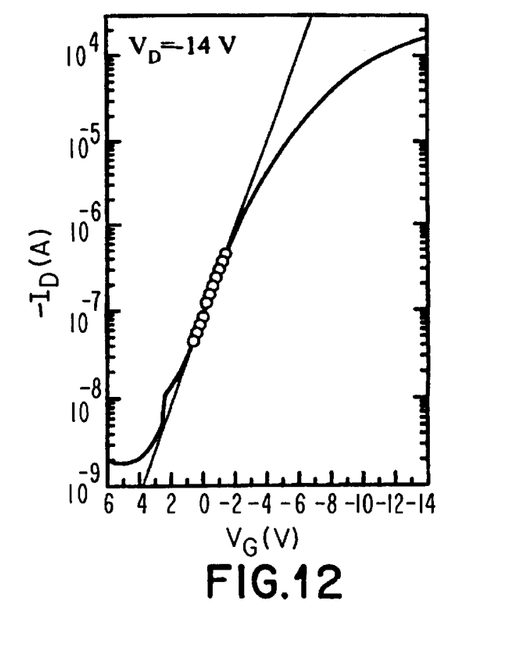
FIG. 12 is the plot of the data from FIG. 11 in a semi logarithmic scale used to calculate the current modulation and sub-threshold slope.
Figure 13:
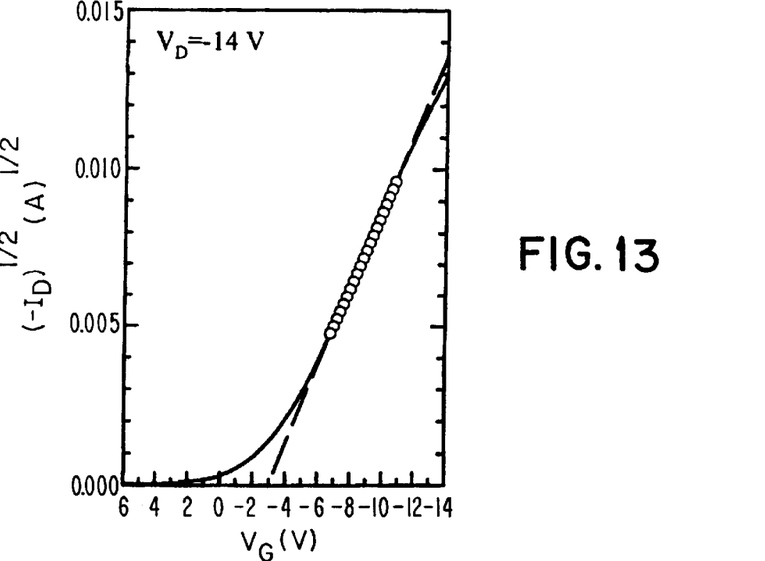
FIG. 13 is a plot of the data from FIG. 12 as the square root of the drain current as a function of the gate voltage in the saturation regime in order to calculate the field effect mobility.

Referring to FIGS. 11, 12 and 13 which are depictions of data measured and plotted similarly to FIGS. 8 and 10 from another TFT device fabricated by the procedure described in connection with FIGS. 2–7; except that the channel length L is 11.2 $\mu$m and the width was 1500 $\mu$m. Calculated values of the various characteristic parameters are very close to the ones described in connection with FIGS. 8–10.

Figures 14, 15, 16:
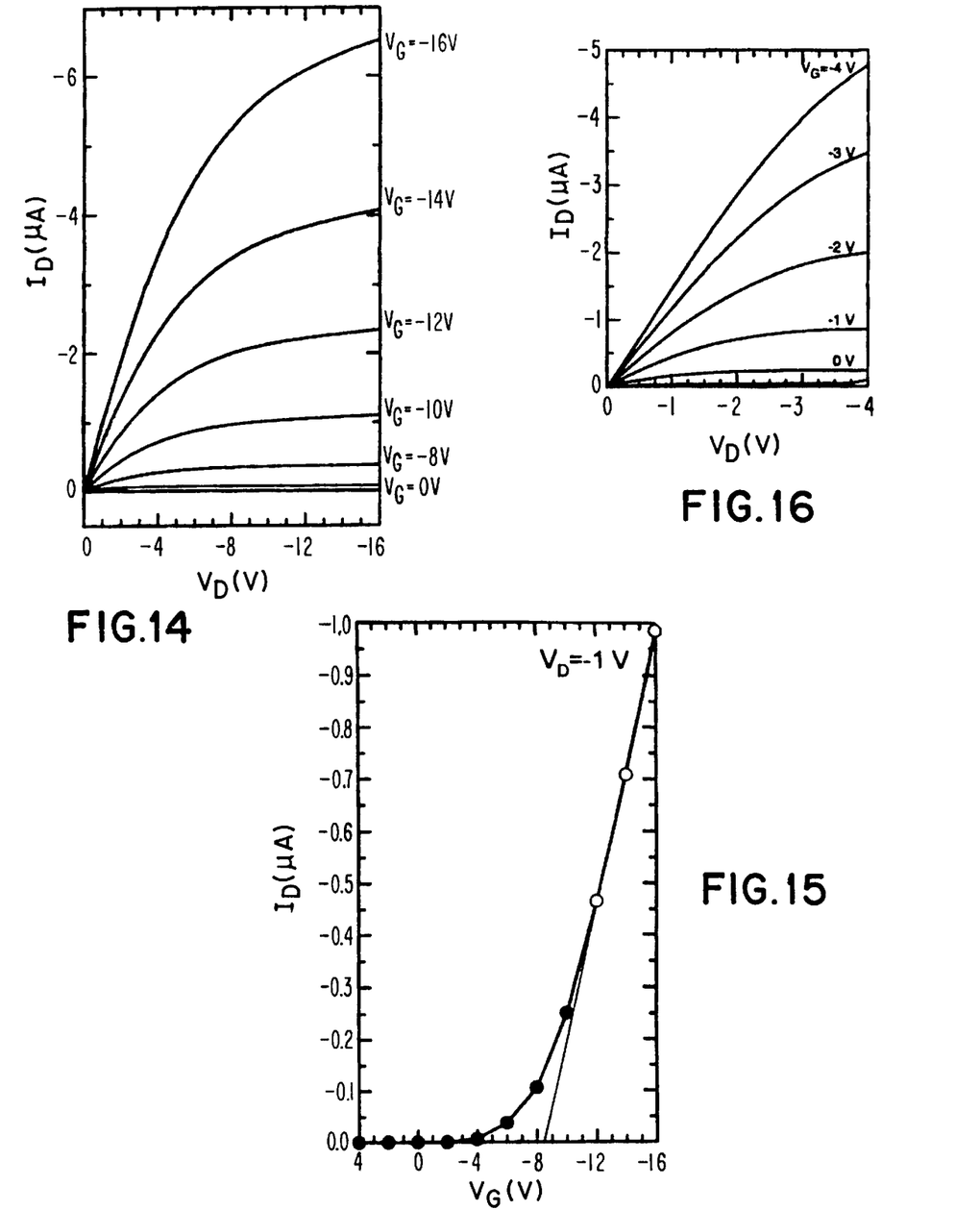

Referring to FIGS. 14 and 15 which are characteristics from another TFT device with a BZT gate insulator that is 1280 Å thick and which has a channel length of 125 $\mu$m and a channel width of 500 $\mu$m. FIG. 14 shows the measured drain current ($I_D$) vs the drain voltage ($V_D$) at various gate voltage levels showing the expected TFT behavior. FIG. 15 shows the $I_D$ versus $V_G$ plot for this device in the linear regime rather than in the saturation regime as shown in FIGS. 8–10 and 11–13. The mobility calculated from this linear regime analysis is 0.27 cm$^2$ V$^{-1}$ sec$^{-1}$. All of these different characteristics are considered to be adequate for the use of such TFT's in display applications.

As an example of the broadening of the available substrates an Example 3 is provided that illustrates the invention with plastic substrates.

EXAMPLE 3

TFT devices are fabricated on transparent polycarbonate substrates that are 0.020" thick which is about 0.5 mm using a sputtered BZT gate insulator that is about 1280 Å in thickness deposited by the sputtering process as described in connection with FIG. 7 and using the steps described in connection with FIGS. 2–6 for depositing the other layers.

Measurements of TFT characteristics were performed as described in Example 2. Referring to FIG. 16 which shows the drain current versus drain voltage plot for a TFT device on this type of substrate with a channel length of 69 $\mu$m and channel width of 1500 $\mu$m. The mobility for this device was calculated to be 0.14 cm$^2$ V$^{-1}$ sec$^{-1}$ while $\mu$=0.20 cm$^2$ V$^{-1}$ sec$^{-1}$ in the saturation regime. Mobility values as high as 0.38 cm$^2$ V$^{-1}$ sec$^{-1}$ were measured from devices with a W/L ratio of 4. These are the highest reported mobilities from devices fabricated on plastic substrate, and they are obtained at a maximum gate voltage of 4 V and hence are well suited for display applications.

Earlier attempts to fabricate organic semiconductor transistors on plastic substrates as reported in the publication by Garnier et al. in Science, Vol. 265, 1684, (1994) have produced lower performance than the present invention. The mobilities reported in the Garnier et al. publication are more than three times lower than the mobilities in the present invention. With this invention a low operating voltage and high mobility pentacene based TFT with an inorganic mixed oxide gate insulator can be fabricated with room temperature vicinity processes so as to enable fabrication on transparent plastic substrates.

What has been described here is the broadening of the range of materials and processes that are available for TFT devices by providing in the device structure an organic semiconductor layer that is in contact with an inorganic mixed oxide gate insulator wherein the processing is with the types of techniques that can take place in a room temperature vicinity range.

What is claimed is:

1. In a process of fabricating a low temperature thin film transistor by serial deposition of at least a semiconductor layer in contact with a gate insulation layer, the improvement comprising in combination:

providing a substrate of at least one material talen from the group of polycarbonate, polyethylene terephthalate, silicon, quartz and glass, depositing, by a process taken from the group of sputtering, spinning, evaporation and laser ablation at a substrate temperature in the range of about 25 to 150 degrees C., a gate electrode on said substrate,
      said gate electrode being taken from the group of doped silicon, gold, silver, copper, aluminum, molybdenum, platinum and conducting polymers,
   an inorganic oxide gate insulation layer on said substrate and over said gate,
      said gate insulation being of at least one inorganic oxide taken from the group of inorganic oxides including $Ta_2O_3$, $V_2O_3$, $Ti\,O_2$, the ferroelectric insulators $Bi_4Ti_3O_{12}$, $Ba\,Mg\,F_4$, $Sr\,Ti\,O_3$, and the mixed oxides $Sr\,Bi_2Ta_{(1-x)}Nb_{(x)}O_3$, $PbZr_{(x)}Ti_{(1-x)}O_3$, $BaZr_{(x)}Ti_{(1-x)}O_3$, and $Ba_{(x)}Sr_{(1-x)}TiO_3$, an organic semiconductor layer over said inorganic oxide gate insulation layer and, source and drain electrodes on said organic semiconductor layer overlapping said gate and separated by a channel distance, said source and drain electrodes being taken from the group of doped silicon, gold, silver, copper, aluminum, molybdenum, platinum and conducting polymers.

2. The process of claim 1 wherein said organic semiconductor layer is of the material pentacene.

3. The process of fabricating a low temperature thin film transistor through serial deposition of layers on a substrate, comprising in combination the steps of:

performing said deposition of layers in a temperature range of about 25 to 150 degrees C., and during said deposition, employing at least one room temperature deposition process taken from the group of sputter spinning, evaporation and laser ablation, and serially, depositing a gate electrode on said substrate, depositing an inorganic oxide gate insulation layer on said substrate and over said gate electrode, and, depositing an organic semiconductor layer on said gate insulation layer including a step of depositing source and drain electrodes separated by a channel distance.

4. The process of claim 3 wherein the step of depositing said source and drain electrodes occurs before said step of depositing said organic semiconducting layer.

5. The process of claim 3 wherein the step of depositing said source and drain electrodes occurs after said step of depositing said organic semiconducting layer.

6. The process of claim 3 wherein said room temperature deposition process is sputtering.

7. The process of claim 6 wherein said organic semiconductor is pentacene.

8. The process of claim 7 wherein said gate oxide layer is barium zirconate titanate.

9. The process of claim 8 wherein said gate electrode and said source and drain electrodes are of silicon doped to 0.003 ohm cm.

10. The process of claim 9 wherein said substrate is a layer of polycarbonate plastic.

* * * * *